(12) United States Patent
Noguchi

(10) Patent No.: US 9,127,375 B2
(45) Date of Patent: Sep. 8, 2015

(54) BASE MATERIAL FOR FORMING SINGLE CRYSTAL DIAMOND FILM AND METHOD FOR PRODUCING SINGLE CRYSTAL DIAMOND USING THE SAME

(75) Inventor: Hitoshi Noguchi, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 1350 days.

(21) Appl. No.: 12/591,539

(22) Filed: Nov. 23, 2009

(65) Prior Publication Data

US 2010/0175613 A1     Jul. 15, 2010

(30) Foreign Application Priority Data

Jan. 9, 2009 (JP) ................. 2009-003102

(51) Int. Cl.
*C30B 29/04* (2006.01)
*C30B 25/18* (2006.01)

(52) U.S. Cl.
CPC ............... *C30B 25/18* (2013.01); *C30B 29/04* (2013.01); *Y10T 117/10* (2015.01)

(58) Field of Classification Search
USPC ............... 117/929, 86, 104, 96, 98, 100, 101; 423/446
See application file for complete search history.

(56) References Cited

U.S. PATENT DOCUMENTS 5,753,038 A * 5/1998 Vichr et al. ............ 117/97
7,579,759 B2 * 8/2009 Lee et al. .............. 310/358
2007/0209578 A1   9/2007 Noguchi
2009/0051282 A1 * 2/2009 Ueda et al. ............ 313/506
2009/0176114 A1 * 7/2009 Sawabe et al. ......... 428/471

FOREIGN PATENT DOCUMENTS

| JP | A-2002-231996 | 8/2002 |
| JP | A-2007-238377 | 9/2007 |
| JP | A-2007-284285 | 11/2007 |

OTHER PUBLICATIONS

Ohtsuka et al., "Epitaxial Growth of Diamond on Iridium," *Jpn. J. Appl. Phys.*, 1996, vol. 35, pp. L1072-L1074.
Japanese Office Action in Japanese Patent Application No. 2009-003102; dated Apr. 26, 2011 (with partial English-language translation).
Nov. 15, 2011 Office Action issued in Japanese Patent Application No. 2009-003102 (with partial English translation).
(Continued)

*Primary Examiner* — Robert M Kunemund
(74) *Attorney, Agent, or Firm* — Oliff PLC

(57) ABSTRACT

The present invention is a base material for forming a single crystal diamond comprising, at least, a seed base material of a single crystal and a thin film heteroepitaxially grown on the seed base material, wherein the seed base material is a single crystal diamond and the thin film is Iridium film or Rhodium film. As a result, there is provided a base material for forming a single crystal diamond that enables a single crystal diamond having a high crystallinity to be heteroepitaxially grown thereon and that can be reused repeatedly and a method for producing a single crystal diamond that enables a single crystal diamond having a high crystallinity and a large area to be produced at low cost.

6 Claims, 1 Drawing Sheet

(56) References Cited

OTHER PUBLICATIONS

T. Bauer et al., "Epitaxial lateral overgrowth (ELO) of homoepitaxial diamond through an iridium mesh", Diamond & Related Materials, Apr. 2007, pp. 711-717, vol. 16, Universitat Augsburg, Institut fur Physik, Augsburg, Germany.

Chinese Office Action issued in Chinese Patent Application No. 200910253988.1; dated Aug. 15, 2011 (with partial English-language translation).

* cited by examiner

BASE MATERIAL FOR FORMING SINGLE CRYSTAL DIAMOND FILM AND METHOD FOR PRODUCING SINGLE CRYSTAL DIAMOND USING THE SAME

BACKGROUND OF THE INVENTION

1. Field of the Invention

The present invention relates to a base material for forming a single crystal diamond and a method for producing a single crystal diamond using the base material.

2. Description of the Related Art

Diamond has a wide band gap of 5.47 eV and a very high dielectric breakdown electric field intensity of 10 MV/cm. Furthermore, it has the highest thermal conductivity in materials. Therefore, if this is used for an electronic device, the device is advantageous as a high output electronic device.

Furthermore, diamond has a high drift mobility and is the most advantageous as a high speed electronic device in semiconductors in comparison of Johnson performance index.

Accordingly, diamond is said to be the ultimate semiconductor suitable for high frequency/high power electronic devices.

Therefore, studies of various kinds of electronic devices using a single crystal diamond for a base material has progressed.

Now, the single crystal diamonds for fabrication of a diamond semiconductor are diamonds referred to as Ib type formed by a high-pressure-high-temperature method (HPHT) or IIa type of which purity is enhanced.

However, it is difficult to grow in size while the HPHT method can provide the diamond having a high crystallinity. In addition, a price of the diamond becomes extremely high when its size becomes big. Therefore, it is difficult to put into practical use as a base material for the devices.

Therefore, a CVD single crystal diamond formed by a vapor deposition method is also studied to provide a low cost base material having a large area.

Recently, a homoepitaxial CVD single crystal diamond that is homoepitaxially grown on the HPHT single crystal diamond base material directly by the vapor deposition method was reported (the 20th diamond symposium lecture summary (2006), pp. 6-7).

In this method, since the base material and the single crystal diamond grown use the same material, it is difficult to separate these. Therefore, there are cost problems that, for example, the base material needs implanting ions in advance and a lengthy wet etching separation treatment after growth. Moreover, there is another problem that crystallinity of the single crystal diamond to be obtained deteriorates to a certain degree due to ion implantation of the base material.

As an alternative, a heteroepitaxial CVD single crystal diamond heteroepitaxially grown by a CVD method on a single crystal iridium heteroepitaxially grown on a single crystal MgO was reported (Jpn. J. Appl. Phys. Vol. 35 (1996), pp. 1072-1074).

However, in this method, there is a problem that the base material and the single crystal diamond grown are finely broken due to stress generated between the single crystal MgO and the single crystal diamond grown via the single crystal iridium (sum of internal stress and heat stress). Moreover, crystallinity of the single crystal diamond to be obtained does not achieve a satisfactory level since crystallinity of an available single crystal MgO that is a seed base material is not sufficient.

SUMMARY OF THE INVENTION

The present invention was accomplished in order to solve the aforementioned problems, and its object is to provide a base material for forming a single crystal diamond that enables a single crystal diamond having a high crystallinity to be heteroepitaxially grown thereon and that can be reused repeatedly, and a method for producing a single crystal diamond that enables a single crystal diamond having a high crystallinity and a large area to be produced at low cost.

In order to accomplish the above object, the present invention provides a base material for forming a single crystal diamond comprising, at least, a seed base material of a single crystal and a thin film heteroepitaxially grown on the seed base material, wherein the seed base material is a single crystal diamond and the thin film is Iridium film or Rhodium film.

The base material for forming a single crystal diamond of the present invention comprises, at least, a seed base material of a single crystal diamond and an Iridium film or a Rhodium film heteroepitaxially grown thereon.

As described above, since the seed base material is a single crystal diamond and the Iridium (hereinafter also referred to as Ir) film or the Rhodium (hereinafter also referred to as Rh) film is heteroepitaxially grown, crystallinity of the Ir film or the Rh film can be high. In addition, the single crystal diamond having a high crystallinity can be obtained by the heteroepitaxial growth on a surface of the thin film having such structure.

Moreover, since the seed base material is the diamond that is the same as is grown by a CVD method, the seed base material and the single crystal diamond are not broken due to the stress between these. Furthermore, the single crystal diamond can be easily separated from the base material due to the stress generated at the Ir film or the Rh film. In addition, since the separation is performed cleanly through the Ir film or the Rh film, the seed base material can be reused repeatedly.

Further, it is preferable that the seed base material is a high-pressure-high-temperature synthesis (HPHT) single crystal diamond or a vapor deposited (CVD) single crystal diamond.

In this way, use of the high-pressure-high-temperature synthesis single crystal diamond or the vapor deposited single crystal diamond as the seed base material enables the thin film having a high crystallinity to be formed thereon. As a result, the single crystal diamond having an extremely high crystallinity can be heteroepitaxially grown thereon.

Furthermore, it is preferable that the seed base material has a thickness of 0.03 mm to 15.00 mm.

In this way, when the seed base material has a thickness of 0.03 mm or more, handling of the seed base material can be good and when the seed base material has a thickness of 15.00 mm or less, the seed base material can be easily obtained.

Moreover, it is preferable that the thin film is heteroepitaxially grown on the seed base material by a sputtering method.

In this way, when the thin film is heteroepitaxially grown on the seed base material by a sputtering method in which a growth rate is high, a growth time of the thin film can be shorten.

Moreover, it is preferable that the thin film has a thickness of 0.5 nm to 100 μm.

In this way, when the thin film has a thickness of 0.5 nm or more, crystallinity of the Ir film or the Rh film can be high, and a suitable stress can be generated between the thin film and the single crystal diamond. When the thin film has a thickness of 100 μm or less, since the growth time does not become long, there are no cost disadvantages and since the stress does not become too large, there is no fear that the seed base material and the single crystal diamond are damaged and broken.

Moreover, it is preferable that a surface of the thin film is subjected to a bias treatment for forming a diamond nucleus by a direct-current discharge in which an electrode of the base material side is a cathode.

As describe above, the base material for forming a single crystal diamond that is subjected to a bias treatment for forming a diamond nucleus enables a high quality single crystal diamond to be easily heteroepitaxially grown on the Ir film or the Rh film.

Furthermore, the present invention provides a method for producing a single crystal diamond wherein a single crystal diamond is heteroepitaxially grown on the thin film of the base material for forming a single crystal diamond described in the present specification by a microwave CVD method or a direct-current plasma CVD method.

In this way, the base material for forming a single crystal diamond of the present invention has a high crystallinity and when the single crystal diamond is produced with such base material by the CVD method, the single crystal diamond having a high crystallinity can be obtained. In addition, there is little fear of damage and a break in the method for producing a single crystal diamond.

Moreover, the present invention provides the method for producing a single crystal diamond wherein the single crystal diamond grown is separated from the base material having the single crystal diamond grown by the method for producing a single crystal diamond described in the present specification.

In the base material having the single crystal diamond grown by the method for producing a single crystal diamond described in the present specification, the single crystal diamond grown can be easily separated. Therefore, the single crystal diamond having a high crystallinity can be obtained without damage and a break. In addition, the base material can be reused as the seed base material by polishing the Ir film or the Rh film on a surface thereof to remove. Therefore, there is a great cost advantage.

In this case, the single crystal diamond grown may be separated by immersing the base material having the single crystal diamond grown in pure water or wet etching solution.

By immersing the base material having the single crystal diamond grown in pure water or wet etching solution, the separation can be easier.

As explained above, according to the present invention, there can be provided a base material for forming a single crystal diamond that enables a single crystal diamond having a high crystallinity to be heteroepitaxially grown and that can be reused repeatedly. Moreover, there can be provided a method for producing a single crystal diamond that enables a single crystal diamond having a high crystallinity and a large area to be produced at low cost by using the base material of the present invention.

DETAILED DESCRIPTION OF THE PREFERRED EMBODIMENTS

Figure 1:
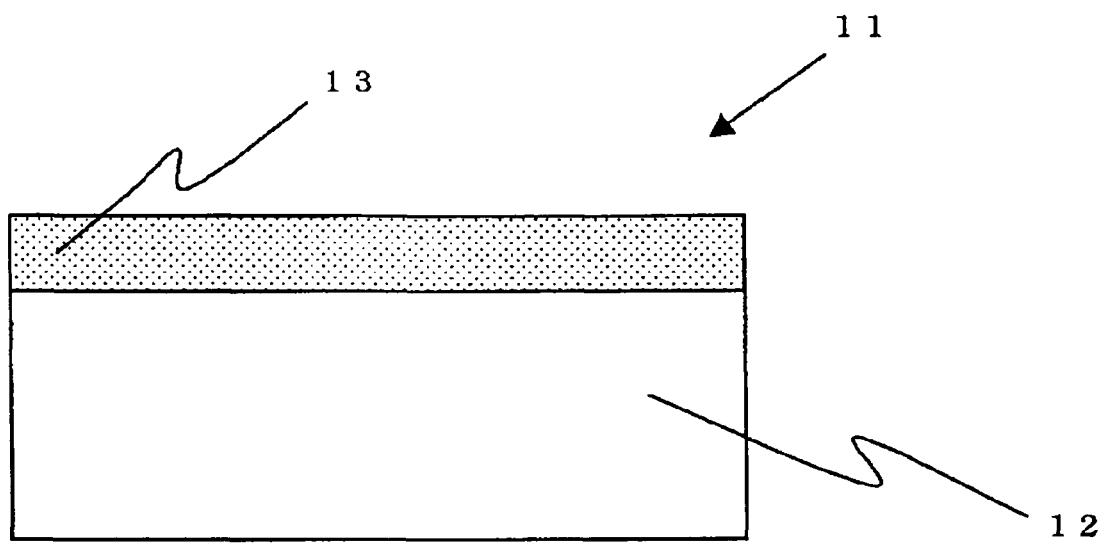
FIG. 1 is a schematic section view showing an example of a base material for forming a single crystal diamond of the present invention.

As mentioned above, conventionally, there are problems that a portion of the single crystal diamond grown cannot be easily separated without damage and further it is difficult to obtain a high crystallinity single crystal diamond grown. Accordingly, the present inventor diligently studied about a type and a structure of the base material and further a method for producing a single crystal.

As a result, the present inventor confirmed that when a base material for forming a single crystal diamond having such a structure that a seed base material is a single crystal diamond having a high crystallinity and a single crystal Ir film or a single crystal Rh film is heteroepitaxially grown thereon is prepared, and a single crystal diamond is heteroepitaxially grown thereon, for example, by a CVD method and the like, a single crystal diamond having a high crystallinity can be obtained. Further the present inventor confirmed that the base material and the single crystal diamond to be grown can be the same material, accordingly the whole single crystal diamond is not broken and the single crystal diamond grown can be easily separated from the base material due to a suitable stress generated at the Ir film or the Rh film that exists in the middle. Thereby, the present invention was accomplished.

Hereinafter, embodiments of the present invention will be explained in detail with reference to the drawings, but the present invention is not restricted thereto. FIG. 1 is a schematic section view showing an example of a base material for forming a single crystal diamond of the present invention.

As shown in FIG. 1, in a base material for forming a single crystal diamond 11 of the present invention, an Ir film or a Rh film (a thin film) 13 is heteroepitaxially grown on a seed base material 12 of a single crystal diamond.

In this case, the seed base material 12 may be a high-pressure-high-temperature synthesis (HPHT) single crystal diamond or a vapor deposited (CVD) single crystal diamond.

Since the high-pressure-high-temperature synthesis single crystal diamond and the vapor deposited single crystal diamond have a very high crystallinity, use of the single crystal diamond described above as the seed base material enables the Iridium film or the Rhodium film having a high crystallinity to be heteroepitaxially grown on a surface thereof. The single crystal diamond having a very high crystallinity can be heteroepitaxially grown on the Ir film or the Rh film. The HPHT single crystal diamond has an advantage that crystallinity is high and the CVD single crystal diamond has an advantage that the diamond with a large area can be easily grown at low cost.

Moreover, the seed base material 12 may have a thickness of 0.03 mm to 15.00 mm.

When the seed base material has a thickness of 0.03 mm or more, handling in a subsequent step can be good. When the seed base material has a thickness of 15.00 mm or less, it can be easily obtained and thus the base material for forming a single crystal diamond can be obtained at lower cost in comparison with a conventional base material.

Moreover, the Ir film or the Rh film 13 may be heteroepitaxially grown on the seed base material 12 by a sputtering method.

In this way, use of the sputtering method in which a growth rate is high, such as R. F. magnetron sputter method, enables time for producing the Ir film or the Rh film on the seed base material to become short due to a high growth rate, and the thin film to be easily grown.

Furthermore, the Ir film or the Rh film 13 may have a thickness of 0.5 nm to 100 μm.

In this way, when the Ir film or the Rh film has a thickness of 0.5 nm or more, crystallinity of the Ir film or the Rh film can be high, and in production of the diamond by the CVD method later, a suitable stress can be generated between the Ir film or the Rh film and the single crystal diamond. Therefore, the single crystal diamond can be easily separated from the base material. When the Ir film or the Rh film has a thickness of 100 μm or less, there is a cost advantage since time for the heteroepitaxial growth does not become longer than is necessary. In addition, it can be suppressed that the stress generated between the base material and the single crystal diamond becomes too large. Therefore, there is no fear that the seed base material and the single crystal diamond are damaged and broken.

Moreover, a surface of the thin film may be subjected to a bias treatment for forming a diamond nucleus by a direct-current discharge in which an electrode of the base material side is a cathode.

The bias treatment may be a method referred to as a bias treatment in Japanese Patent Laid-open (Kokai) No. 2007-238377 and a diamond nucleus in which crystal orientation is uniform can be formed on the surface of the Ir film or the Rh film by performing a pretreatment using the bias treatment method.

In this way, the base material for forming a single crystal diamond preliminarily subjected to a bias treatment for forming a diamond nucleus on the thin film surface by a direct-current discharge in which an electrode of the base material side is a cathode enables the single crystal diamond to be easily heteroepitaxially grown on the Ir film or the Rh film later.

Hereinafter, a method for producing a single crystal diamond using the base material for forming a single crystal diamond described above will be explained. However, the present invention is not of course limited by these explanations.

The single crystal diamond can be heteroepitaxially grown by a microwave CVD method or a direct-current plasma CVD method on the surface of the Ir film or the Rh film of the base material for forming a single crystal diamond in which the diamond nucleus is optionally formed so that the single crystal diamond can be produced.

As described above, the base material for forming a single crystal diamond of the present invention has a high crystallinity. In addition, there is little fear that the base material and the single crystal diamond grown are broken. The single crystal diamond having a high crystallinity can be obtained at high yield by producing a single crystal diamond using the CVD method with the base material described above.

Moreover, the single crystal diamond can be obtained by separating the single crystal diamond grown from the base material having such single crystal diamond grown.

As described above, in the single crystal diamond described in the present specification, the single crystal diamond grown can be easily separated from the base material for forming a single crystal diamond due to the stress generated between the Ir film or the Rh film and the single crystal diamond. Therefore, the single crystal diamond having a high crystallinity and a large area that is the same size of the base material can be obtained without damage and a break. The single crystal diamond obtained by the separation has a high crystallinity and is very advantageous as a device.

In this case, the single crystal diamond grown may be separated by immersing the base material having the single crystal diamond grown in pure water or wet etching solution.

As described above, by immersing the base material having the single crystal diamond grown in pure water or wet etching solution, the single crystal diamond grown can be more easily and surely separated from the base material.

Normally, when the base material after the growth is taken out from a CVD apparatus, a portion of the single crystal diamond grown can be easily separated from the base material. However, sometimes there is a case that an adhesion force remains between the base material and the single crystal diamond grown. In this case, it can be easily separated by immersing in pure water or wet etching solution, such as phosphoric acid solution and the like, and thus while the separation, it can be prevented the base material and the single crystal diamond from being damaged and broken.

On the other, the separated base material for forming a single crystal diamond can be reused as the seed base material by performing a surface treatment for exposure of a clean surface, for example polishing, after removing the Ir film or the Rh film to expose a surface of a single crystal diamond that is the seed base material. Accordingly, the single crystal diamond seed base material can be used many times and even if an expensive seed base material is used, a production cost of the single crystal diamond can be reduced.

As described above, in the base material for forming a single crystal diamond of the present invention, since the seed base material is the single crystal diamond and the Iridium film or the Rhodium film is heteroepitaxially grown thereon, crystallinity of the Ir film or the Rh film can be high. In addition, the single crystal diamond having a high crystallinity can be obtained by heteroepitaxially growing a single crystal diamond by the CVD method and the like on the surface of the thin film of the base material for forming a single crystal diamond having the structure described above.

Moreover, since the seed base material is the same diamond that is grown by the CVD method, the seed base material and the single crystal diamond are not broken due to the stress between the base material and the single crystal diamond grown. Furthermore, in the base material for forming a single crystal diamond, the single crystal diamond grown can be easily separated from the base material due to a suitable stress generated at the Ir film or the Rh film that exists in the middle. In addition, since the separation is performed cleanly through the Ir film or the Rh film and the seed base material is hardly broken, the seed base material can be reused repeatedly and thus a cost can be reduced.

EXAMPLES

Hereinafter, the present invention will be more specially explained by showing Example and Comparative Examples. However, the present invention is not limited to these.

Example 1

As the seed base material, there was prepared a double-side polished HPHT single crystal diamond having a 5.0 mm square, a thickness of 0.5 mm, and an orientation (100).

A single crystal Ir film was heteroepitaxially grown on a surface of the seed base material on which a diamond was supposed to be grown to fabricate the base material for forming a single crystal diamond. The film-forming was completed to perform sputtering in a condition that Ar gas of $6 \times 10^{-2}$ Torr (8 Pa) and a base material temperature of 700° C. by R. F. magnetron sputter method in which an target is Ir until a thickness of the single crystal Ir film became 1.5 μm. Except for making the base material temperature 100° C. for the sake of electrical continuity in a bias treatment and a direct-current plasma CVD, Ir having a thickness of 1.5 μm was also grown on a back surface in the same condition.

Next, the bias treatment was performed for forming a diamond nucleus on a surface of the single crystal Ir film of the base material for forming a single crystal diamond.

First, the base material was placed on a negative voltage-applying electrode (cathode) of a bias treatment apparatus, and then vacuum exhaust was performed. Next, after the base material was heated to 600° C., a hydrogen-diluted methane gas of 3 vol. % was introduced so that pressure became 120 Torr ($1.6 \times 10^4$ Pa). Then, the bias treatment was performed. That is, DC voltage was applied to both the electrodes to apply a prescribed DC electricity.

Last, the single crystal diamond was heteroepitaxially grown on the surface of the single crystal Ir film of the base material to which the bias treatment was performed at 900° C. for 30 hours.

After finishing the growth, it was confirmed that the product was cooled to room temperature. Then, the atmosphere was introduced into a chamber and a bell jar was opened. In the product on a positive voltage-applying electrode (anode), the single crystal diamond heteroepitaxially grown was separated from the base material for forming a single crystal diamond.

The single crystal diamond grown was finished by polishing its surface so that the single crystal diamond had a 5.0 mm square and a thickness of 150 µm that is approximately the same size of the base material.

It was confirmed that the obtained single crystal diamond had a sufficient crystallinity as a result of evaluation by raman spectroscopy, XRD rocking curve, X-sectional TEM and cathodoluminescence (CL).

Moreover, the used base material for forming a single crystal diamond was polished to expose a clean surface of the seed base material of a single crystal diamond after removing the single crystal Ir film and then it was able to be reused as a new seed base material of a single crystal diamond.

Example 2

Except for making the growth time of the single crystal diamond 9 hours (aim at a thickness of 60 µm) in the last direct-current plasma CVD, the single crystal diamond was produces in a condition similar to that in Example 1. Then, it was confirmed that the product was cooled to room temperature, the atmosphere was introduced into a chamber and a bell jar was opened.

In this case, the single crystal diamond heteroepitaxially grown and a portion of the base material were adhered with a weak force in the product on the anode. Thus, the product was immersed in boiled pure water for 1 hour and was taken out. As a result, the single crystal diamond was able to be separated from the base material cleanly. Moreover, although there was a portion that Ir slightly remained on the surface of the Ir film side of the seed base material of a single crystal diamond, it was able to be easily removed by subsequent polishing processing.

The single crystal diamond grown in the condition of example 2 was able to be finished by polishing its surface so that the single crystal diamond had a 5.0 mm square and a thickness of 50 µm that is approximately the same size of the base material.

It was confirmed that the obtained single crystal diamond had a sufficient crystallinity as a result of evaluation by raman spectroscopy, XRD rocking curve, X-sectional TEM and cathodoluminescence (CL).

Moreover, the base material for forming a single crystal diamond was polished to expose a clean surface of the seed base material of a single crystal diamond after removing the Ir film and then it was able to be reused as a new seed base material of single crystal diamond.

Comparative Example

Except for using a double-side polished single crystal MgO having a 5.0 mm square, a thickness of 0.5 mm, and an orientation (100) as the seed base material, a single crystal Ir film was grown and a bias treatment was performed in a condition similar to that in Example 1 so that a base material for forming a single crystal diamond was prepared. Then, production of a single crystal diamond was attempted by heteroepitaxially growing a single crystal diamond on the base material by the direct-current plasma CVD method.

However, as a result of observation of the product in a chamber after opening a bell jar, the single crystal MgO base material and the single crystal diamond were broken into pieces having an approximate 1.0 mm square.

The piece of the single crystal diamond was taken out and its crystallinity was evaluated. As a result, it was observed that raman full width at half maximum was wide, a lot of dislocation defects existed in X-sectional TEM and the like. Thus, the crystallinity was insufficient level for a device.

Naturally, the reuse of the single crystal MgO broken into pieces was impossible.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

What is claimed is:

1. A method for forming a single crystal diamond, comprising:
    preparing a base material for forming the single crystal diamond by heteroepitaxially growing a thin film of iridium or rhodium on a whole a er surface of a single crystal diamond seed base material by a sputtering method;
    subjecting a surface of the thin film to a bias treatment for forming a diamond nucleus by a direct-current discharge in which an electrode of the base material side is a cathode;
    heteroepitaxially growing the single crystal diamond on the thin film of the base material by a microwave CVD method or a direct-current plasma CVD method; and
    separating the grown single crystal diamond from the base material.

2. The method according to claim 1, wherein the single crystal diamond seed base material is a high-pressure-high-temperature synthesis single crystal diamond or a vapor deposited single crystal diamond.

3. The method according to claim 1, wherein the single crystal diamond seed base material has a thickness of 0.03 mm to 15.00 mm.

4. The method according to claim 2, wherein the single crystal diamond seed base material has a thickness of 0.03 mm to 15.00 mm.

5. The method according to claim 1, wherein the thin film has a thickness of 0.5 nm to 100 µm.

6. The method for producing a single crystal diamond according to claim 1, wherein the grown single crystal diamond is separated by immersing the base material having the grown single crystal diamond in pure water or wet etching solution.

* * * * *